(12) United States Patent
Denda (10) Patent No.: US 7,432,137 B2
(45) Date of Patent: Oct. 7, 2008

(54) METHOD OF MANUFACTURING THIN FILM TRANSISTOR

(75) Inventor: Atsushi Denda, Chino (JP)

(73) Assignee: Seiko Epson Corporation, Tokyo (JP)

( * ) Notice: Subject to any disclaimer, the term of this patent is extended or adjusted under 35 U.S.C. 154(b) by 526 days.

(21) Appl. No.: 11/197,320

(22) Filed: Aug. 5, 2005

(65) Prior Publication Data

US 2006/0079032 A1    Apr. 13, 2006

(30) Foreign Application Priority Data

Sep. 28, 2004    (JP)    ............... 2004-281129

(51) Int. Cl.
*H01L 21/00*    (2006.01)
*H01L 21/84*    (2006.01)

(52) U.S. Cl. ............ 438/149; 438/197; 438/680; 438/780; 257/E21.17; 257/E21.224; 257/E21.227; 257/E21.229; 257/E21.246; 257/E21.347; 257/E21.411

(58) Field of Classification Search ............ 438/149, 438/154, 197, 270, 291, 267, 308, 513, 680, 438/706, 746, 780, 791
See application file for complete search history.

(56) References Cited

U.S. PATENT DOCUMENTS

| | | | |
|---|---|---|---|
| 6,630,274 B1 * | 10/2003 | Kiguchi et al. | ............ 430/7 |
| 6,670,104 B2 | 12/2003 | Kido | |
| 6,852,524 B2 * | 2/2005 | Okamura et al. | ......... 435/287.1 |
| 7,068,247 B2 * | 6/2006 | Nakanishi | ............ 345/76 |
| 7,070,890 B2 * | 7/2006 | Kiguchi et al. | ............ 430/7 |
| 7,136,127 B2 | 11/2006 | Furusawa | |
| 7,282,779 B2 * | 10/2007 | Hasei | ............ 257/520 |
| 2003/0060038 A1 * | 3/2003 | Sirringhaus et al. | ......... 438/637 |

FOREIGN PATENT DOCUMENTS

| | | |
|---|---|---|
| JP | A 2002-026011 | 1/2002 |
| JP | A 2003-317945 | 11/2003 |
| JP | A 2003-318131 | 11/2003 |
| JP | A 2004-158815 | 6/2004 |
| JP | A 2004-266197 | 9/2004 |

* cited by examiner

*Primary Examiner*—David Nhu
(74) *Attorney, Agent, or Firm*—Oliff & Berridge, PLC

(57) ABSTRACT

A method of manufacturing a thin film transistor includes forming a gate electrode on a substrate; forming a gate insulating film on the gate electrode; forming a semiconductor layer on the gate insulating film; forming a bank including a first bank portion and a second bank portion, the first bank portion being located at substantially a central portion of the semiconductor layer, the second bank portion having a thin film portion for surrounding the semiconductor layer and a thick film portion for surrounding the thin film portion at a periphery of the semiconductor layer; arranging first functional liquid containing a conductive material in a region surrounded by the thin film portion and the first bank portion such that the first functional liquid covers the semiconductor layer; drying the first functional liquid to obtain a first conductive film; removing the thin film portion selectively after drying the first functional liquid; arranging second functional liquid including a conductive material on a region from which the thin film portion is removed such that the second functional liquid extends to the first conductive film; and drying the second functional liquid to obtain a second conductive film.

8 Claims, 5 Drawing Sheets

METHOD OF MANUFACTURING THIN FILM TRANSISTOR

This application claims the benefit of Japanese Patent Application No. 2004-281129, filed Sep. 28, 2004. The entire disclosure of the prior application is hereby incorporated by reference herein in its entirety.

BACKGROUND OF THE INVENTION

1. Technical Field

The present invention relates to a method of manufacturing a thin film transistor.

2. Related Art

When manufacturing a thin film transistor (TFT) serving as a switching element used in an electro-optical device, such as a liquid crystal device, a photolithography method has been used in a process of forming an electrode, a wiring line, or the like. The photolithography method forms a conductive film using existing film forming methods known as a sputtering method, a plating method, or a CVD method, applies a photosensitive material called a resist on a substrate, develops the resist by radiating light thereon, etches the conductive film according to a resist pattern, and forms a wiring line pattern or an electrode of a functional thin film. In the case in which the functional thin film is formed using the photolithography method, when a film forming process and an etching process are performed, large equipment such as a vacuum device and a complicated process are required, and a usage effectiveness of the material is only several percent, and thus most of the material is wasted, which causes a manufacturing cost to increase and causes productivity to deteriorate.

Accordingly, one method has been suggested in which an electrode pattern or a wiring line pattern (thin film pattern) is formed on a substrate using a droplet ejection method (a so-called inkjet method) to eject a droplet of a liquid material from a droplet ejection head (for example, Japanese Unexamined Patent Application Publication No. 2003-317945). In this method, ink for a thin film pattern, which is functional liquid obtained by dispersing conductive fine particles of metal fine particles or precursors thereof, is coated directly on a substrate, and is converted into a thin conductive film pattern by performing a thermal process or laser irradiation. According to this method, since a conventional complicated film forming process, a photolithography process, and an etching process become unnecessary, the process becomes simple, the amount of utilization of a raw material is small, and productivity increases.

According to the method disclosed in Japanese Unexamined Patent Application Publication No. 2003-317945, a bank is formed corresponding to a desired thin film pattern, and functional liquid is ejected between the banks and is then dried or baked, thereby obtaining a thin film pattern. However, according to this method, since the main object is to form a single thin film pattern, a technology for forming a laminated film obtained by laminating two films using functional liquid or a connection film obtained by connecting the two films is not disclosed.

As disclosed in Japanese Unexamined Patent Application Publication No. 2003-317945, when the second functional film including the side surface of the first functional film is laminated on the first functional film or connected to the first functional film after forming the first functional film using the bank, it is necessary that the bank be formed again and modified using the photolithography method. As such, when the bank is formed again, there occurs a problem in precision when the photolithography method is carried out, or there is a problem in that the number of processes increases, which results in an increase in costs. In addition, when there is a step difference that has a thickness of more than a thickness of a film formed on a base of an electrode or wiring line formed using the functional liquid, a thickness difference after forming a film significantly increases due to characteristics of a thin forming method using the functional liquid, thereby causing a short circuit of a film.

SUMMARY

An advantage of the invention is that it provides a method of manufacturing a thin film transistor in which it includes a process of forming an electrode or a wiring line on a stepped portion using functional liquid and by which a deposition film or a connection film are formed on the stepped portion easily and suitably.

According to an aspect of the invention, there is provided a method of manufacturing a thin film transistor, including: forming a gate electrode on a substrate; forming a gate insulating film on the gate electrode; forming a semiconductor layer on the gate insulating film; forming a bank including a first bank portion and a second bank portion, the first bank portion being located at substantially a central portion of the semiconductor layer, the second bank portion having a thin film portion for surrounding the semiconductor layer and a thick film portion for surrounding the thin film portion at a periphery of the semiconductor layer; arranging first functional liquid containing a conductive material in a region surrounded by the thin film portion and the first bank portion such that the first functional liquid covers the semiconductor layer; drying the first functional liquid to obtain a first conductive film; removing the thin film portion selectively after drying the first functional liquid; arranging second functional liquid including a conductive material on a region from which the thin film portion is removed such that the second functional liquid extends to the first conductive film; and drying the second functional liquid to obtain a second conductive film.

According to this aspect, it is possible to form the first conductive film and the second conductive film connected to at least a side surface of the first conductive film easily and suitably by forming a bank once.

Specifically, the first conductive film is formed in a region surrounded by the thin film portion and the first bank portion, and the second conductive film is formed in a region from which the thin film portion is removed. In this case, the second conductive film is formed such that it is connected to at least a side surface of the first conductive film.

As a result, it is possible to obtain a connection film in which the second conductive film is connected to at least a side surface of the first conductive film. In addition, a bank having a stepped portion is formed in advance without forming the bank twice, the thin film portion is removed, and a bank for forming the second conductive film is formed.

That is, since the bank forming process (photolithography) is not necessary twice in obtaining the connection film, the cost can be reduced. In addition, since the position alignment is not necessary when the second bank forming process is performed, it is possible to easily obtain the conductive film pattern having the high position precision.

In addition, the first conductive film is formed to cover the semiconductor layer. The first conductive film has one end serving as a source electrode and the other end serving as a drain electrode through the first bank portion, and serves as a barrier film for protecting the semiconductor layer. In addition, the second conductive film, which is connected to at least the side surface of the first conductive film, serves as a wiring line for connecting the source electrode and the source wiring line and a wiring line for connecting the drain electrode and the drain wiring line (for example, pixel electrode).

On the other hand, in the related art, in order to perform protective insulation between the source and the drain in the semiconductor layer, a film is formed of silicon nitride using a plasma CVD method, and is then patterned using a photolithography technology. However, according to this aspect, since the first bank portion serves as a member for insulating the source electrode from the drain electrode in order to form the first conductive film, it is not necessary that the insulating film be formed using the plasma CVD method, and be then patterned using the photolithography technology.

In addition, the second bank portion, which has a stepped structure composed of a thin film portion and a thick film portion, can be formed using the photolithography method. Specifically, by exposing (half exposure) a portion of the photosensitive resin layer after forming the photosensitive resin layer having a uniform thickness, without the stepped structure, it is possible to form a stepped portion composed of the thin film portion and the thick film portion. In addition, the removal of the thin film portion can be easily performed by, for example, the plasma ashing.

In this case, the first functional liquid and the second functional liquid may be the same. That is, the first and second functional liquids may contain the same conductive material (functional material) and the same solvent or the same conductive material and a different solvent. In addition, the first and second functional liquids may have a different conductive material and a different solvent.

Preferably, in the arranging of the first functional liquid and the arranging the second functional liquid, functional liquid is arranged by a droplet ejection method using a droplet ejection device. In this case, the functional liquid is suitably arranged in a region surrounded by the bank.

Preferably, in the arranging of the first functional liquid and the arranging the second functional liquid, functional liquid is arranged by a CAP coating method using a capillary phenomenon. In this case, the functional liquid is suitably arranged in a region surrounded by the bank.

Preferably, the method of forming a thin film further includes performing a lyophobic process on a surface of the bank after forming the bank. In this case, the functional liquid does not remain on the bank, so that the functional liquid is suitably arranged in a region surrounded by the bank.

BRIEF DESCRIPTION OF THE DRAWINGS

The invention will be described with reference to the accompanying drawings, wherein like numbers reference like elements, and wherein.

DESCRIPTION OF THE EMBODIMENTS

Hereinafter, a method of manufacturing a thin film transistor according to preferred embodiments of the invention will be described with reference to the accompanying drawings. In addition, the scale of each layer or member has been adjusted in order to have a recognizable size in the drawings.

First Embodiment

A method of manufacturing a thin film transistor according to a first embodiment of the invention will be described with reference to FIGS. 1 and 2. In the method of manufacturing the thin film transistor described below, banks are formed, and an electrode pattern and a wiring line pattern are formed in a region surrounded by the banks through a droplet ejection method using a droplet ejection device. Hereinafter, each process will be described in detail.

Process of Forming Gate Electrode and Source Wiring Line

Figure 1A:
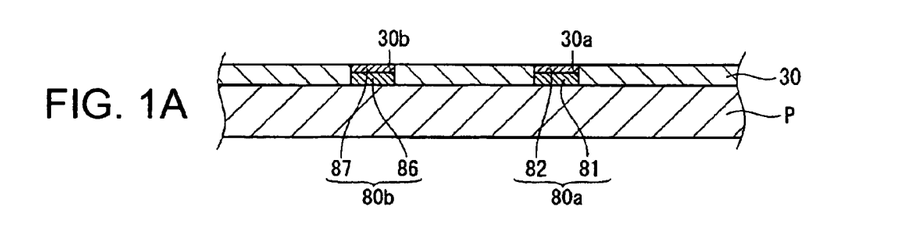
FIGS. 1A to 1D are cross-sectional views schematically illustrating a process of forming a wiring line pattern according to a first embodiment of the invention.
Figure 2A:
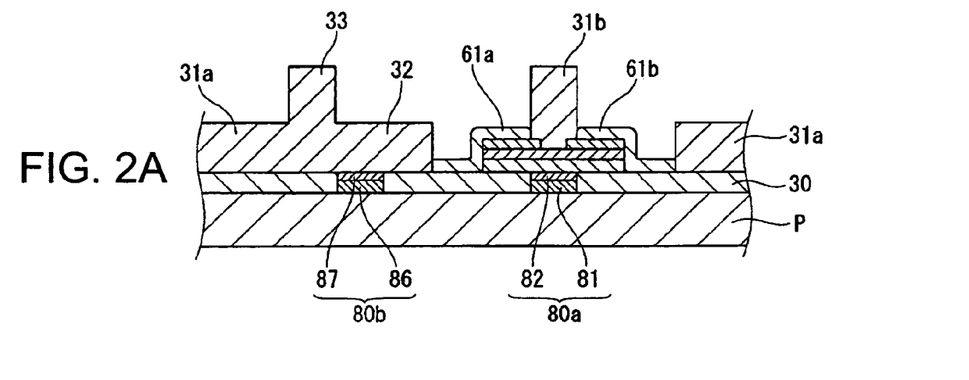
FIGS. 2A to 2C are cross-sectional views schematically illustrating a process of forming a wiring line pattern subsequent to the process of FIGS. 1A to 1D.
Figure 2B:
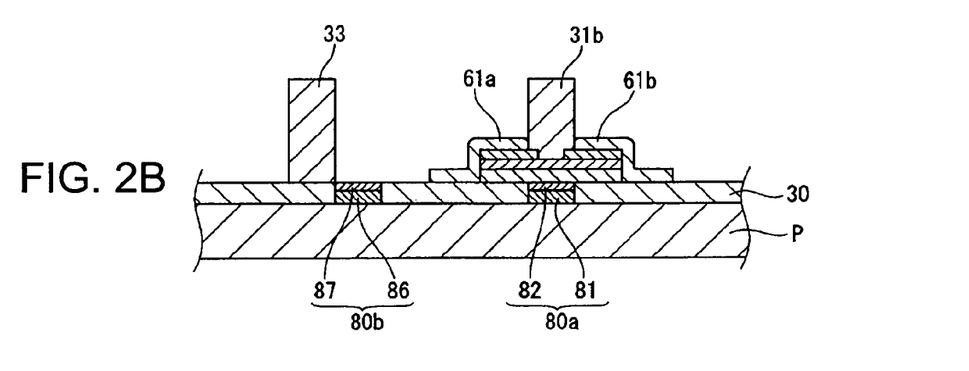

First, in order to form a gate electrode and a source wiring line in a predetermined pattern, as shown in FIG. 1A, a bank 30, which includes an opening 30a and an opening 30b each having a predetermined pattern, is formed on a glass substrate P. The bank 30 functions as a partition member, and can be formed by any method, such as a lithography method and a printing method. For example, when the bank is formed by using the lithography method, an organic photosensitive material, such as an acryl resin, is applied on the substrate P using a predetermined method, such as a spin coating method, a spray coating method, a roll coating method, a die coating method, or a deep coating method, in accordance with the height of the bank to be formed, and a photosensitive material layer is then formed. In addition, ultraviolet rays are radiated onto the photosensitive material layer according to a desired bank shape, thereby forming the bank 30 having the opening 30a for a gate electrode and the opening 30b for a source wiring line.

Next, a first electrode layer 81 made of silver and a second electrode layer 82 made of nickel are formed in the opening 30a, and the first electrode layer 81 and the second electrode layer 82 are laminated to form a gate electrode 80a. On the other hand, a first electrode layer 86 made of silver and a second electrode layer 87 made of nickel are formed in the opening 30b, and the first electrode layer 86 and the second electrode layer 87 are laminated to form a source wiring line 80b. At this time, the first electrode layers 81 and 86 may be made of copper or aluminum, and an alloy using the metal as a main component in addition to the silver.

Process of Forming Gate Insulating Film

A gate insulating film 83 made of silicon nitride is formed on the gate electrode 80a. In this case, after forming a film over the entire surface of the bank using a plasma CVD method, a predetermined pattern is formed by using the photolithography method. As a raw gas used in this process, a mixed gas of monosilane and dinitrogen monoxide or TEOS (tetraethoxysilane, $Si(OC_2H_5)_4$) and oxygen, and disilane and ammonia may be suitably used, and the gate insulating film 83 is formed with a thickness of about 150 to 400 nm.

Process of Forming Semiconductor Layer

Figure 1B:
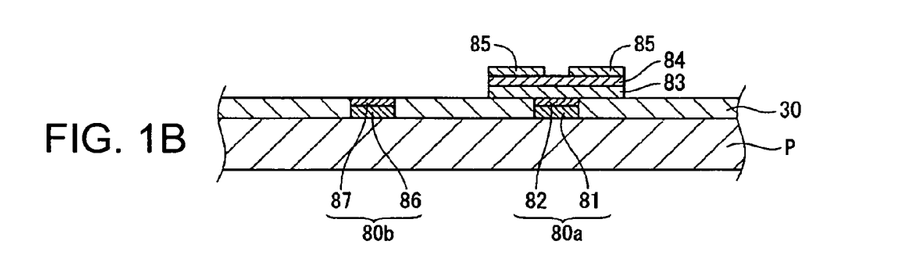

Next, using the plasma CVD method, a semiconductor layer 84 is formed on the entire surface of the substrate P where the gate insulating film 83 is formed, such that it has a thickness of 150 to 250 nm. As a raw gas used in this process, silane or monosilane may be suitably used. Next, as shown in FIG. 1B, an ohmic layer 85, which is made of N+Si and has a thickness of 50 to 100 nm, is formed on the semiconductor layer 84. Then, as shown in FIG. 1B, the semiconductor layer and the ohmic layer are patterned in a predetermined shape using the photolithography method, and are then respectively formed on a region where a source electrode will be formed and a region where a drain electrode will be formed.

Bank Forming Process

After forming the semiconductor layer 84 and the ohmic layer 85, a bank is formed in order to form the source electrode and the drain electrode. The bank functions as a partition member, and can be formed by any method, such as the lithography method and the printing method. For example, when the bank is formed by using the lithography method, an organic photosensitive material, such as an acryl resin, is applied on the substrate P using a predetermined method, such as the spin coating method, the spray coating method, the roll coating method, the die coating method, or the deep coating method in accordance with the height of the bank to be formed, and a photosensitive material layer is then formed.

Figure 1C:
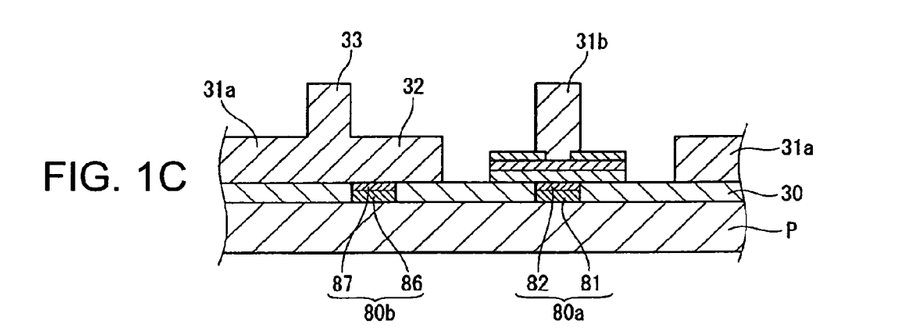

In addition, ultraviolet rays are radiated onto the photosensitive material layer according to the formed bank shape. Here, two kinds of banks, that is, a first bank portion and a second bank portion, are formed. First, as shown in FIG. 1C, the first bank portion 31b is exposed to light by ultraviolet radiation such that it is located substantially at a central portion of the semiconductor layer 84 on the semiconductor layer 84 and the ohmic layer. Specifically, the first bank portion 31b is formed at a location to divide the source electrode and the drain electrode on the semiconductor layer 84 and the ohmic layer.

On the other hand, as shown in FIG. 1C, a second bank portion 31a is formed to surround the semiconductor layer 84 at the periphery of the semiconductor layer 84. The second bank portion 31a has a stepped structure in which it has a thin film portion 32 located at the semiconductor layer 84 side and a thick film portion 33 surrounding the thin film portion 32. In order to form the second bank portion 31a having the stepped structure, so-called half exposure is performed by radiating ultraviolet rays having a different intensity of a radiation pattern.

Specifically, in the exposure process (not shown), using a photomask in which slits are formed, ultraviolet rays L1 having a predetermined pattern (reduce the intensity of the ultraviolet rays transmitted through the mask) are radiated to a middle portion of the photosensitive material layer in a thickness direction, and at the same time, ultraviolet rays L2, which have a relatively smaller pattern and higher intensity than those of the ultraviolet rays L1, are radiated to the bottom portion of the photosensitive material layer (the surface of the substrate P) with respect to a region located more at an inner side than the region radiated by the ultraviolet rays L1. As described above, the photosensitive layer is exposed to the light, and thus the second bank portion 31a is formed in which it has the thin film portion 32 having a relatively small thickness and the thick film portion 33 having a relatively large thickness, and has an opening pattern according to the desired electrode pattern (wiring line pattern).

In order to remove resist residues (organic materials) between the bank portions 31a and 31b at the time of formation of the banks, a residue process is performed. For the residue process, an ultraviolet (UV) irradiation process in which ultraviolet rays are radiated to perform the residue process or an $O_2$ plasma process using oxygen in the atmosphere as a processing gas can be selected. In the present embodiment, the $O_2$ plasma process is performed.

Specifically, oxygen in a plasma state is radiated onto the substrate P from a plasma discharge electrode. As an example of the $O_2$ plasma processing conditions, a plasma power is 50 to 1000 W, an oxygen gas flow rate is 50 to 100 ml/min, a relative movement rate of a substrate P to the plasma discharge electrode is 0.510 to 10 mm/sec, and a substrate temperature is 70 to 90° C. In addition, in the case in which the substrate P is a glass substrate, its surface has a lyophilic property with respect to the electrode forming material. However, by performing the $O_2$ plasma process or the ultraviolet irradiation process in order to perform the residue process as in this embodiment, it is possible to further increase the lyophilic property of a surface of the substrate exposed between the banks.

Lyophobic Process

Next, the lyophobic process is performed on the bank portions 31a and 31b to provide a lyophobic property to their surfaces. As the lyophobic process, a plasma processing method ($CF_4$ plasma processing method) using tetrafluoromethan as a processing gas in the atmosphere can be employed. As conditions of the $CF_4$ plasma process, for example, a plasma power is 50 to 1000 kW, a tetrafluoromethane gas flow rate is 50 to 100 ml/min, a relative movement rate of a substrate to the plasma discharge electrode is 0.5 to 1020 mm/sec, and a substrate temperature is 70 to 90° C. In addition, it is to be noted that the process gas is not limited to tetrafluoromethane (carbon tetrafluoride), but any other gas of the fluorocarbon type may be used.

By performing this lyophobic process, a fluorine radical is introduced to a resin constituting the bank portions 31a and 31b, thereby providing a high lyophobic property to the bank portions. Now, the above-mentioned $O_2$ plasma process may be performed prior to the formation of the bank portions 31a and 31b. Nevertheless, because a pretreatment of the acrylic resin, the polyimide resin, and the like by the $O_2$ plasma process contributes to making the resin easier to become fluorination (lyophobic property), it is preferable to carry out the $O_2$ plasma process after forming the bank portions 31a and 31b.

As a result of the lyophobic process with respect to the bank portions 31a and 31b, the surface of the substrate P, which is given the lyophilic property through the residue process in advance, may be somewhat affected. Nonetheless, if the substrate P is made of glass and the like, introduction of the fluorine radical through the lyophobic process does not occur, so that the substrate P may not virtually lose its lyophilic property, that is, wettability. In addition, the bank portions 31a and 31b are formed of a material having a lyophobic property (for example, a resin material having a fluorine radical), so that the lyophobic process may be omitted.

First Material Arranging Process

Figure 1D:
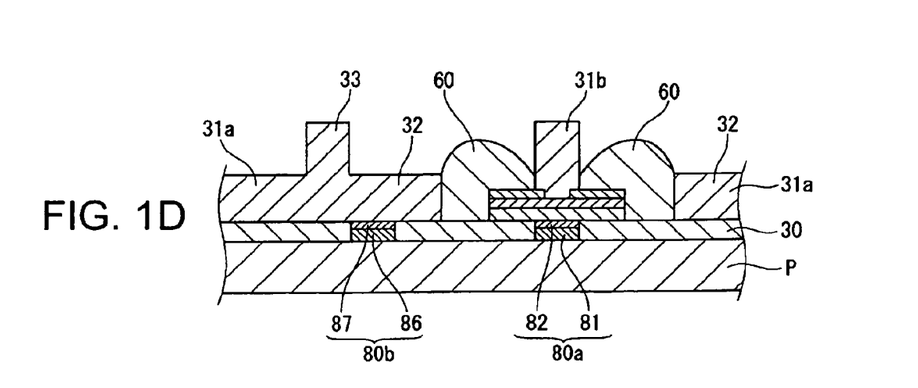

Next, by using the liquid droplet ejection method based on a liquid droplet ejection device, a liquid droplet of an electrode forming material is applied in a region, which is surrounded by the first bank portion 31b and the thin film portion 32 of the second bank portion 31a. In addition, it is to be noted that Ni is used as a conductive particle, and ink in which water and diethanolamine are used as a solvent (dispersion medium) is ejected.

In the first material arranging process, as shown in FIG. 1D, droplets 60 of liquid materials containing the electrode forming materials are ejected from the droplet ejection head of the droplet ejection device, and are arranged in a region surrounded by the first bank portion 31b and the thin film portion 32. The droplets are ejected under the conditions of an ink weight of 4 ng/dot and an ink rate (ejection rate) of 5 to 7 m/sec. At this time, since the bank portions 31a and 31b are given a lyophobic property, even though some of the ejected droplets are loaded on the bank portions, the surfaces of the banks have a lyophobic property. Therefore, the liquid materials (droplets) 60, which are repelled and dropped from the bank portions, are dropped in a region surrounded by the firs bank portion 31b and the thin film portion 32, as shown in FIG. 1D.

In the present process, the droplets of the electrode forming ink (functional liquid) containing the conductive particles are ejected from nozzles of the droplet ejection head using the droplet ejection method, and thus the electrode pattern constituting the thin film transistor is formed. The droplet ejection device used in the present embodiment may employ the structure shown in FIG. 5.

Figure 5:
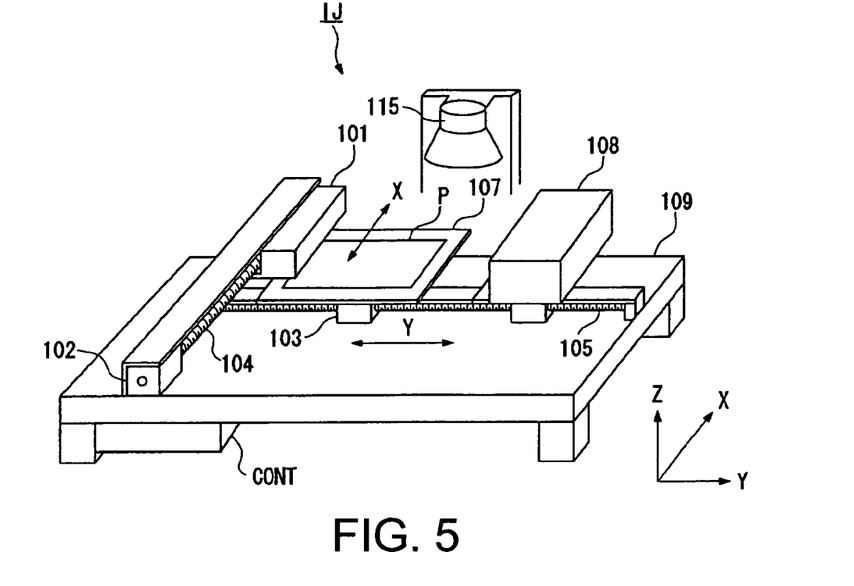
FIG. 5 is a schematic perspective view of a droplet ejection device.

FIG. 5 is a perspective view schematically showing the structure of a droplet ejection device IJ used in the present embodiment.

The droplet ejection device IJ includes a droplet ejection head 101, an X-direction driving shaft 104, a Y-direction guide shaft 105, a controller CONT, a stage 107, a cleaning mechanism 108, a base 109, and a heater 115.

The stage 107 supports the substrate P for arranging ink (liquid material) using the droplet ejection device IJ, and has a fixing mechanism (not shown) for fixing the substrate P to a reference position.

The droplet ejection head 101 is a multi-nozzle-type droplet ejection head having a plurality of ejection nozzles, and its longitudinal direction aligns with the Y-axis direction. The plurality of ejection nozzles are arranged on a bottom surface of the droplet ejection head 101 at predetermined gaps in the Y-axis direction. The ink including the above-described conductive fine particles is ejected from the ejection nozzles of the droplet ejection head 101 to the substrate P supported by the stage 107.

An X-direction driving motor 102 is connected to the X-direction driving shaft 104. The X-direction driving motor 102 is, for example, a stepping motor, and rotates the X-direction driving shaft 104 when an X-direction driving signal is supplied from the controller CONT. When the X-direction driving shaft 104 rotates, the droplet ejection head 101 moves in the X-axis direction.

The Y-direction guide shaft 105 is fixed so as not move to the base 109. The stage 107 includes a Y-direction driving motor 103. The Y-direction driving motor 103 is, for example, a stepping motor, and moves the stage 107 in the Y-axis direction when a Y-direction driving signal is supplied from the controller CONT.

The controller CONT supplies a voltage for controlling the droplet ejection to the droplet ejection head 101. In addition, it supplies a driving pulse signal for controlling the movement of the droplet ejection head 101 in the X-direction to the X-direction driving motor 102, and supplies a driving pulse signal for controlling the movement of the stage 107 in the Y-axis direction to the Y-direction driving motor 103.

The cleaning mechanism 108 cleans the droplet ejection head 101. A Y-direction driving motor (not shown) is provided in the cleaning mechanism 108. By driving the Y-direction driving motor, the cleaning mechanism moves along the Y-direction guide shaft 105. Movement of the cleaning mechanism 108 is also controlled by the controller CONT.

The heater 115 is a unit for thermally treating the substrate P by means of lamp annealing, and carries out evaporation and drying of the solvent contained in the liquid material applied on the substrate P. Whether power is supplied to the heater 115 or not is also controlled by the controller CONT.

The droplet ejection device IJ ejects droplets to the substrate P while relatively scanning the stage 107 supporting the substrate P and the droplet ejection head 101. Hereinafter, the X-axis direction is referred to as a scanning direction, and the Y-axis direction orthogonal to the X-axis direction is referred to as a non-scanning direction. Accordingly, the ejection nozzles of the droplet ejection head 101 are arranged in the Y-axis direction, serving as the non-scanning direction, at predetermined intervals. In FIG. 5, although the liquid droplet ejection head 101 is placed at a right angle to an advancing direction of the substrate P, the angle of the liquid droplet ejection head 101 may be adjusted so as to intersect the advancing direction of the substrate P. Accordingly, a pitch between nozzles can be adjusted by adjusting the angle of the droplet ejection head 101. In addition, a distance between the substrate P and the nozzle plane may be arbitrarily adjusted.

Figure 6:
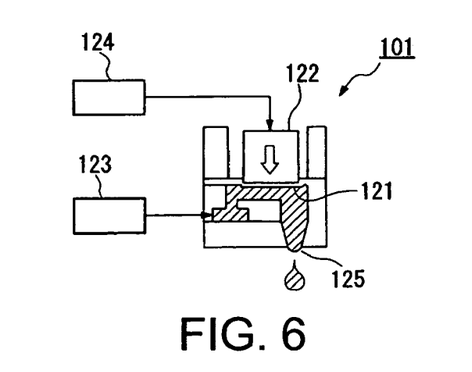
FIG. 6 is a schematic diagram illustrating an ejection principal of a liquid material through a piezo system.

FIG. 6 is an explanatory view illustrating a principle of liquid material ejection according to a piezo system.

In FIG. 6, a piezo element 122 is arranged adjacent to a liquid chamber 121 accommodating a liquid material (electrode forming ink or functional liquid). The liquid material is supplied through a liquid material supplying system 123 including a material tank accommodating the liquid material in the liquid chamber 121. The piezo element 122 is connected to a driving circuit 124, and a voltage is applied to the piezo element 122 through the driving circuit 124 to deform the piezo element 122. As a result, the liquid chamber 121 is deformed, and the liquid materials are ejected from the nozzle 125. In this case, the value of the applied voltage can be changed to control the amount of distortion of the piezo element 122. In addition, the frequency of the applied voltage can be changed to control the speed of distortion of the piezo element 122. The droplet ejection using the piezo system does not apply heat to the material, and thus a composition of the material is not affected.

The ink for forming an electrode used in the present embodiment is a dispersion solution in which the conductive fine particles are dispersed in a dispersion medium, or a precursor thereof. In addition, the metal fine particles containing any one of gold, silver, copper, palladium, niobium, and nickel, precursors thereof, alloys, oxides, and fine particles, such as conductive polymer or indium tin oxides, are used as the conductive fine particles. Surfaces of these conductive fine particles may be coated with an organic material in order to enhance a dispersive property. The diameter of the conductive fine particle is preferably within a range of from 1 nm to 0.1 µm. When the diameter exceeds 0.1 µm, the nozzles of the droplet ejection head 101, which will be described below, may be clogged, and the density of the obtained film may be deteriorated. In addition, when the diameter is less than 1 nm, a volume ratio of a coating agent with respect to the conductive fine particle increases, thereby significantly increasing a ratio of an organic material in a film to be obtained.

As the dispersion medium, so long as it is capable of dispersing the above-mentioned conductive fine particles without causing aggregation, there is no specific restriction. For example, in addition to water, it is possible to use alcohols, such as methanol, ethanol, propanol, and butanol; hydrocarbon compounds, such as n-heptane, n-octane, decane, dodecane, tetradecane, toluene, xylene, cymene, durene, indene, dipenten, tetrahydronaphthalene, decahydronaphthalene, and cyclohexylbenzene; ether compounds, such as ethyleneglycoldimethylether, ethyleneglycoldimethylethylether, ethyleneglycolmethylethylether, diethyleneglycoldimethylether, diethyleneglycoldiethylether, diethyleneglycolmethylethylether, 1,2-dimethoxyethane, bis(2-methoxyethyl) ether, and p-dioxane; and polar compounds such as propylenecarbonate, gamma-butyrolactone, N-methyl-2-pyrroridone, dimethylformamide, dimethylsulfoxyde, and cyclohexanone. Of these substances, water, alcohols, hydrocarbons, and ether compounds are preferable in terms of dispersibility of particulates and stability of a dispersed liquid as well as ease of application to the liquid droplet ejection method (inkjet method). As a more preferable dispersion media, water and hydrocarbons may be cited.

A surface tension of the dispersion solution of the conductive fine particles is preferably in a range of 0.02 to 0.07 N/m. When the surface tension is less than 0.02 N/m in the case in which liquid is ejected using an inkjet method, wettability of the ink composition with respect to a nozzle surface increases, thus a flying curve tends to occur. When the surface tension exceeds 0.07 N/m, a meniscus shape at a front end of the nozzle is not stable, thus it is difficult to control an ejection amount or ejection timing. In order to control the surface tension, a surface tension adjusting agent, such as a fluoric agent, a silicon agent, and a nonionic agent, may be added into the dispersion solution in a range of not significantly decreasing a contact angle with the substrate. The nonionic surface tension adjusting agent serves to enhance the wettability of the liquid to the substrate, improves a leveling property of a film, and prevents fine unevenness from occurring on the film. The surface tension adjusting agent may contain an organic compound, such as alcohol, ether, ester, and ketone, if necessary.

The viscosity of the dispersion solution is preferably 1 to 50 mPa·s. In the case in which the liquid material is ejected as droplets using the inkjet method, when the viscosity is less than 1 mPa·s, a nozzle periphery is contaminated by an outflow of the ink. In addition, when the viscosity exceeds 50 mPa·s, the clogging occurs very often at the nozzle opening, which makes it difficult to eject the droplets smoothly and reduces the amount of the droplet ejection.

Intermediate Dry Process

After the droplet made of the electrode forming ink is ejected to the substrate, in order to remove the dispersion medium, a dry process is carried out, if necessary. The dry process is performed by a common hotplate or electric furnace to heat up the substrate P. In the present embodiment, the heating process is continuously performed during 60 minutes at a temperature of 180° C. This heating process is not necessarily performed in the atmosphere like in $N_2$ atmosphere.

In addition, the dry process may be performed through lamp annealing. As a light source used for lamp annealing, though it is not specifically limited, there may be used an infrared lamp, a xenon lamp, a YAG laser, an argon laser, a carbonic acid gas laser, and an excimer laser, such as XeF, XeCl, XeBr, KrF, KrCl, ArF, and ArCl. For these light sources, those having a range of an output from 10 to 5000 W are typically used. However, in this embodiment, a range of an output from 100 to 1000 W is sufficient. By carrying out the intermediate dry process, desired electrode patterns $61a$ and $61b$ are formed, as shown in FIG. 2A. Here, the electrode $61a$ functions as a source electrode, and the electrode $61b$ functions as the drain electrode.

Thin Film Portion Removing Process

Next, the thin film portion 32 is selectively removed from the bank portions formed on the substrate P. Specifically, the thin film portion is removed through an ashing process. As the ashing process, plasma ashing or ozone ashing can be employed. According to the plasma ashing, by causing gas, such as an oxygen gas in a plasma state, to react with the banks, the plasma ashing vaporizes and removes the banks. The bank is a solid material made of carbon, oxygen, and hydrogen, and as it enters into chemical reaction with oxygen plasma, it becomes $CO_2$, $H_2O$, and $O_2$, so that it may be all removed as gas. On the other hand, the basic principle of the ozone ashing is the same as the plasma ashing in that $O_3$ (ozone) is dissolved and is converted to active oxygen of a reactive gas, thereby causing the active oxygen to react with the banks. The bank, which has reacted with the active oxygen, becomes $CO_2$, $H_2O$, and $O_2$, so that it may be all removed as gas.

In addition, in order to selectively remove the thin film portion 32, as an example of the $O_2$ plasma processing conditions, a plasma power is 500 to 1000 W, an oxygen gas flow rate is 50 to 100 ml/min, a relative movement rate of a substrate P with respect to the plasma discharge electrode is 0.510 to 10 mm/sec, and a substrate temperature is 70 to 90° C. In addition, by performing this removing process through the ashing process, the thin film portion 32 is selectively removed, as shown in FIG. 2B.

Second Material Arranging Process

Next, by using the liquid droplet ejection method based on the liquid droplet ejection device IJ, a wiring line pattern forming material is applied in a region in which the thin film portion 32 is selectively removed. In addition, it is to be noted that silver is used as a conductive particle, and ink in which diethyleneglycoldiethylether is used as a solvent (dispersion liquid) is ejected.

In the second material arranging process, droplets of liquid materials containing the wiring line pattern forming materials are ejected from the droplet ejection head of the droplet ejection device, and are arranged in a region in which the thin film portion 32 is removed on the substrate P. The droplets are ejected under the conditions of an ink weight of 4 ng/dot and an ink speed (ejection speed) of 5 to 7 m/sec. At this time, since the bank portions $31a$ and $31b$ are given a lyophobic property, even though some of the ejected droplets are loaded on the bank portions $31a$ and $31b$, the surfaces of the banks have a lyophobic property. Therefore, the liquid materials, which are repelled and dropped from the bank portions $31a$ and $31b$, are dropped in a region surrounded by the thick film portion 33 and the first bank portion $31b$.

Intermediate Dry Process

After the droplet is ejected to the substrate, in order to remove the dispersion medium, a dry process is carried out, if necessary. The dry process is performed by a common hotplate or electric furnace to heat up the substrate P. In the present embodiment, the heating process is continuously performed during 60 minutes at a temperature of 180° C. This heating process is not necessarily performed in the atmosphere like in $N_2$ atmosphere.

In addition, the dry process may be performed through lamp annealing. As a light source used for lamp annealing, though it is not specifically limited, there may be used an infrared lamp, a xenon lamp, a YAG laser, an argon laser, a carbonic acid gas laser, and an excimer laser, such as XeF, XeCl, XeBr, KrF, KrCl, ArF, and ArCl. For these light sources, those having a range of an output from 100 to 5000 W are typically used. However, in this embodiment, the range of an output from 100 to 1000 W is sufficient. By carrying out the intermediate dry process, desired wiring line patterns 62 and 63 are formed, as shown in FIG. 2C. Here, the wiring line pattern 62 functions as a wiring line for connecting the drain electrode 61*b* and the pixel electrode (not shown), and the wiring line pattern 63 functions as a wiring line for connecting the source electrode 61*a* and the source wiring line 80*b*.

Baking Process

It is necessary that the dispersion medium be entirely removed for a dry film after the ejection process in order to ensure a superior electrical contact between conductive particles. In addition, when a coating agent, such as an organic material, is coated on the surface of the conductive fine particle in order to improve dispersibility, it is necessary to remove the coating agent. For this reason, the heat treatment or optical treatment is performed on the substrate after the ejection process.

Although the heat treatment and/or optical treatment is typically carried out in the atmosphere, if necessary, it may be carried out in an inert gas atmosphere, such as nitrogen, argon, and helium. A processing temperature of the heat treatment and/or optical treatment is suitably determined by taking into consideration a boiling point of the dispersion medium (steam pressure), the kind or pressure of an atmosphere gas, dispersibility of fine particles, and thermal behavior, such as oxidizability, existence and quantity of the coating agent, a heat-resistant temperature of a base, and the like. For example, in order to remove the coating agent made of an organic material, it is necessary to bake it at a temperature of about 300° C. However, in order to prevent the characteristic shift of the thin film transistor, the heat treatment is preferably performed at a temperature of less than 250° C. In addition, when a plastic substrate is used, the heat treatment is preferably performed in the range of room temperature to 100° C. By means of the above-mentioned process, a dry film after the ejection process secures electrical connection between fine particles and is converted into a conductive film.

Figure 2C:
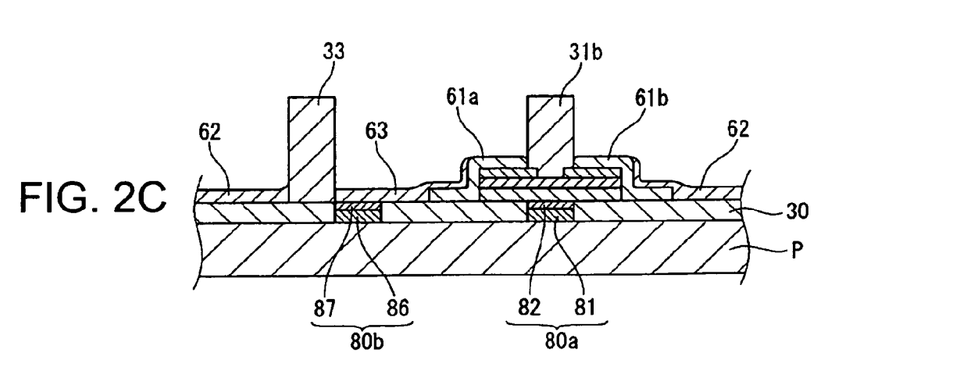

By means of the above-mentioned process, the thin film transistor is formed, as shown in FIG. 2C. In the present embodiment, the electrodes 61*a* and 61*b* and the wiring lines 63 and 62 connected to at least side surfaces of the electrodes 61*a* and 61*b* are collectively formed by forming a bank once. Specifically, the electrodes 61*a* and 61*b* are formed in the region surrounded by the thin film portion 32 and the first bank portion 31*a*. The wiring lines 63 and 62 are formed in a region in which the thin film portion 32 is removed. The respective wiring lines 63 and 62 are formed such that they are connected to at least the side surfaces of the electrodes 61*a* and 61*b*. As such, the bank portion 31*b* having a stepped portion is formed in advance without forming the bank twice, the thin film portion 32 is removed, and a bank for forming the wiring lines 63 and 62 is formed.

That is, according to the manufacturing method of the present embodiment, it is not necessary that the bank forming process be performed twice, so that the cost can be reduced. In addition, since the position adjustment is not necessary when the second bank forming process is performed, it is possible to easily obtain the electrode and wiring line pattern having the high position precision. In addition, in the present embodiment, since the first bank portion 31*a* functions as a member (insulating member) for separating the source electrode 61*a* from the drain electrode 61*b*, an additional process for forming the insulating member is not needed. In addition, the first bank portion 31*a* according to the present embodiment functions as a protective film for protecting the semiconductor layer 84 and the ohmic layer 85.

Second Embodiment

Next, a method of manufacturing a thin film transistor according to a second embodiment of the invention will be described with reference to FIGS. 3 and 4. In the method of manufacturing a thin film transistor described below, banks are formed, and an electrode pattern and a wiring line pattern are formed in a region surrounded by the banks through a droplet ejection method using a droplet ejection device. Hereinafter, each process will be described in detail.

Process of Forming Gate Electrode

Figure 3A:
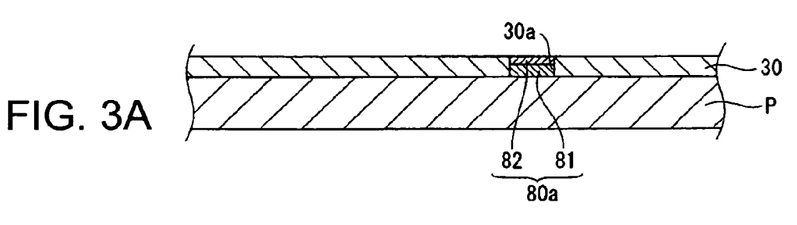
FIGS. 3A to 3D are cross-sectional views schematically illustrating a process of forming a wiring line pattern according to a second embodiment of the invention.

Similar to the above-mentioned first embodiment, as shown in FIG. 3A, a bank 30, which has an opening 30*a*, is formed, and a gate electrode 80*a* is formed in the opening 30*a*. Specifically, a first electrode layer 81 made of silver and a second electrode layer 82 made of nickel are formed in the opening 30*a*, and the first electrode layer 81 and the second electrode layer 82 are laminated to form a gate electrode 80*a*.

Process of Forming a Gate Insulating Film

Next, a gate insulating film 83 made of silicon nitride is formed on the bank (insulating film) 30 including the gate electrode 80*a*. Since the method of forming the gate insulating film uses a plasma CVD method in the same manner as the first embodiment, a film is formed over the entire surface of the substrate P.

Process of Forming Semiconductor Layer

Figure 3B:
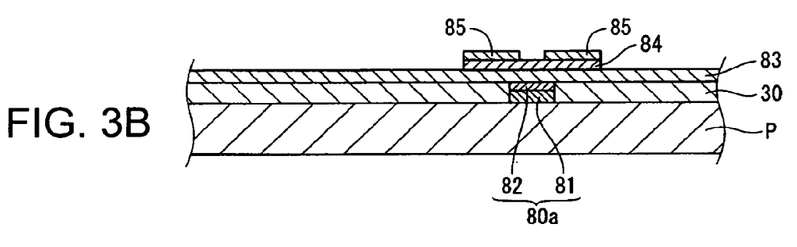

Next, using the plasma CVD method, a semiconductor layer 84 is formed on the entire surface of the substrate P where the gate insulating film 83 is formed, such that it has a thickness of 150 to 250 nm. As a raw gas used in this process, silane or monosilane may be suitably used. Next, as shown in FIG. 3B, an ohmic layer 85, which is made of $N^+Si$ and has a thickness of 50 to 100 nm, is formed on the semiconductor layer 84. Then, as shown in FIG. 3B, the semiconductor layer and the ohmic layer are patterned in a predetermined shape using the photolithography method, and are then respectively formed on a region where a source electrode will be formed and a region where a drain electrode will be formed.

Bank Forming Process

Figure 3C:
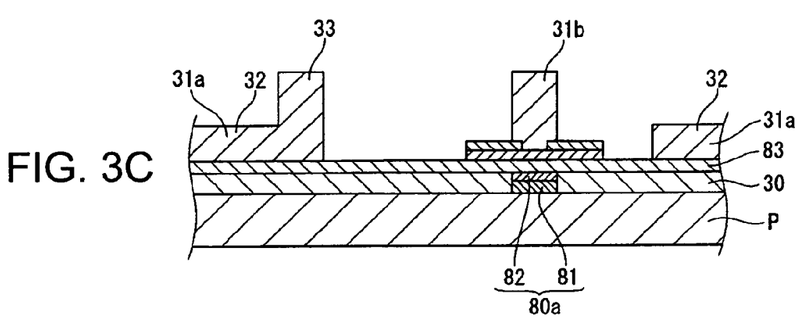

Using the same method as the first embodiment, the first bank portion 31*b* and the second bank portion 31*a* having the opening pattern are formed, as shown in FIG. 3C. With respect to the second bank portion 31*a*, a photosensitive material layer is formed, and is subjected to a half exposure. As a result, it can be formed as a bank having a stepped structure including the thin film portion 32 and the thick film portion 33. However, the thin film portion 32 is not formed in the source electrode forming region. In addition, in order to remove residues of a resist (organic material) when the bank is formed, the residue process may be performed on the substrate P.

Lyophobic Process

Next, the lyophobic process is performed on the bank 35 to provide a lyophobic property to its surface. For the lyophobic process, similar to the first embodiment, a plasma processing method ($CF_4$ plasma processing method) using tetrafluoromethan as a processing gas in the atmosphere can be employed.

First Material Arranging Process

Figure 3D:
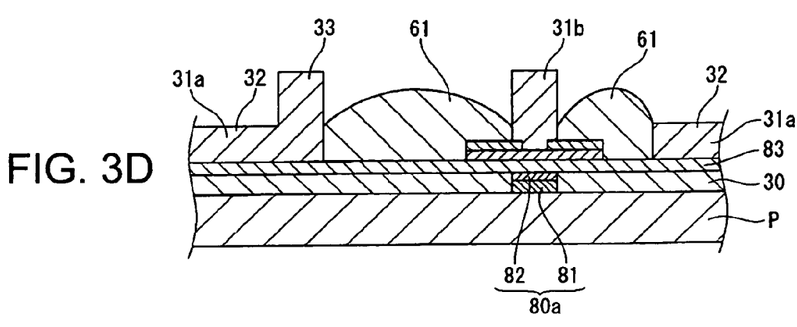

Next, by using the liquid droplet ejection method based on a liquid droplet ejection device, an electrode forming material is applied in a region which is surrounded by the first bank portion 31*b* and the second bank portion 31*a*. In addition, it is to be noted that nickel is used as a conductive particle, and ink in which water and diethanolamine are used as a solvent (dispersion medium) is ejected.

In the first material arranging process, as shown in FIG. 5, droplets 61 (FIG. 3D) of liquid materials containing the electrode forming materials are ejected from the droplet ejection head 101 of the droplet ejection device IJ, and are arranged in a region surrounded by the first bank portion 31b and the second bank portion 31a. The droplets are ejected under the conditions of an ink weight of 4 ng/dot and an ink speed (ejection speed) of 5 to 7 m/sec. At this time, since the bank portions 31a and 31b are given a lyophobic property, even though some of the ejected droplets are loaded on the bank portions, the surfaces of the banks have a lyophobic property. Therefore, the liquid materials (droplets) 61, which are repelled and dropped from the bank portions, are dropped in a region surrounded by the firs bank portion 31b and the second bank portion 31a, as shown in FIG. 1D.

Intermediate Dry Process

After the droplet made of the electrode forming ink is ejected to the substrate, in order to remove the dispersion medium, a dry process is carried out, if necessary. The dry process is performed by a common hotplate or electric furnace to heat up the substrate P. In the present embodiment, the heating process is continuously performed during 60 minutes at a temperature of 180° C. This heating process is not necessarily performed in the atmosphere like $N_2$ atmosphere or reduced pressure.

Figure 4A:
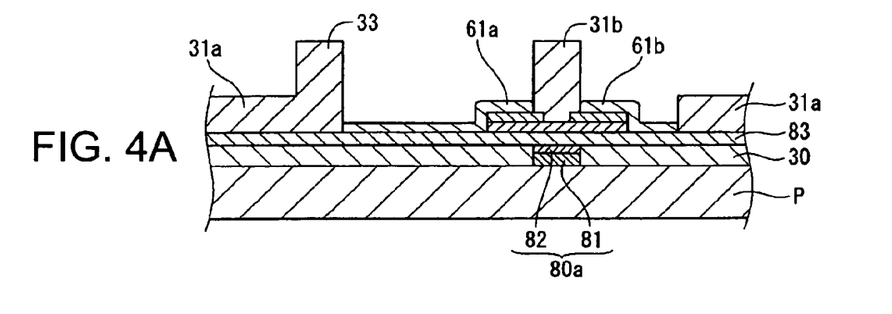
FIGS. 4A to 4D are cross-sectional views schematically illustrating a process of forming a wiring line pattern subsequent to the process of FIGS. 3A to 3D.

In addition, the dry process may be performed through lamp annealing. As a light source used for lamp annealing, though it is not specifically limited, there may be used an infrared lamp, a xenon lamp, a YAG laser, an argon laser, a carbonic acid gas laser, and an excimer laser, such as XeF, XeCl, XeBr, KrF, KrCl, ArF, and ArCl. For these light sources, those having a range of an output from 10 to 5000 W are typically used. However, in this embodiment, a range of an output from 100 to 1000 W is sufficient. By carrying out the intermediate dry process, desired electrode patterns 61a and 61b are formed, as shown in FIG. 4A. Here, the electrode 61a functions as a source electrode, and the electrode 61b functions as the drain electrode.

Second Material Arranging Process

Figure 4B:
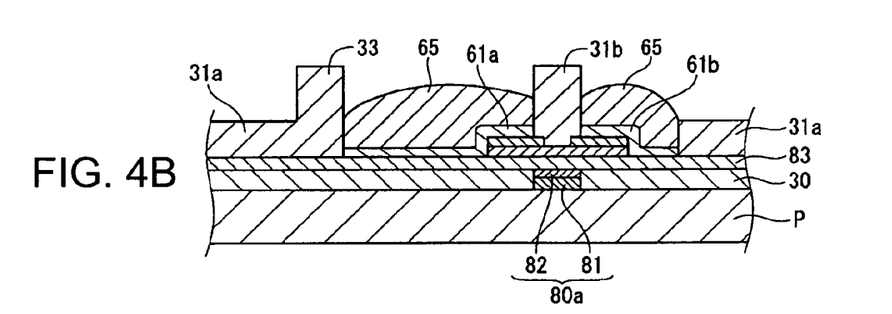

Next, by using the droplet ejection method based on a droplet ejection device IJ, a wiring line pattern forming material is applied in a region in which the electrodes 61a and 61b are formed. In addition, it is to be noted that silver is used as a conductive particle, and ink (dispersion liquid) 65 in which diethyleneglycoldiethylether is used as a solvent (dispersion medium) is ejected, as shown in FIG. 4B.

Intermediate Dry Process

Figure 4C:
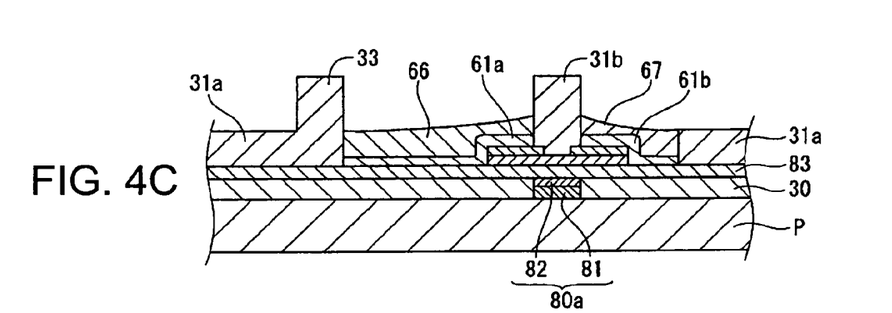

After the droplet is ejected to the substrate, in order to remove the dispersion medium, a dry process is carried out, if necessary. The dry process is performed by a common hotplate or electric furnace to heat up the substrate P. In the present embodiment, the heating process is continuously performed during 60 minutes at a temperature of 180° C. This heating process is not necessarily performed in the atmosphere like in $N_2$ atmosphere. By carrying out the intermediate dry process, desired wiring line patterns 66 and 67 are formed, as shown in FIG. 4C. Here, the wiring line pattern 67 functions as a wiring line for connecting the drain electrode 61b and the pixel electrode (not shown), and the wiring line pattern 66 functions as a wiring line for connecting the source electrode 61a and the source wiring line (not shown).

Thin Film Portion Removing Process

Next, the thin film portion 32 is removed from the second bank portion 31a. Here, it is selectively removed through the ashing in the same manner as the first embodiment.

Third Material Arranging Process

Figure 4D:
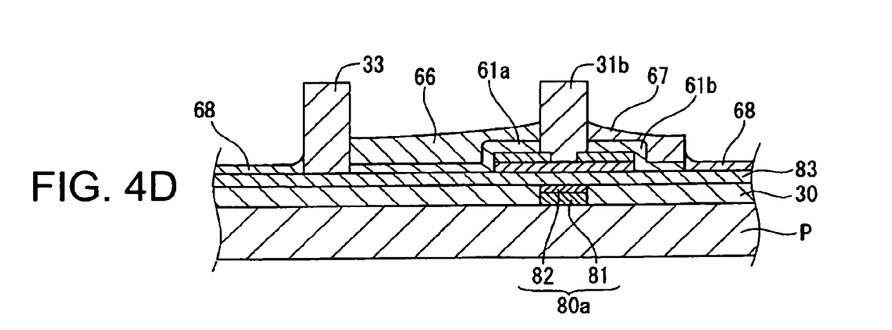

In addition, as shown in FIG. 4D, a conductive film 68, which is made of an ITO (indium tin oxide) and is used for a pixel electrode, is formed in a region where the thin film portion 32 is removed. In addition, ink for forming a pixel electrode may be a dispersion liquid of a transparent conductive particle, such as ITO, IZO, and FTO, and ink obtained by dispersing precursors of the materials or organic compounds. In this case, the ink can be applied using the above-mentioned droplet ejection device IJ.

Baking Process

It is necessary that the dispersion medium be entirely removed for a dry film after the ejection process in order to ensure a superior electrical contact between conductive particles. In addition, when a coating agent, such as an organic material, is coated on the surface of the conductive fine particle in order to improve dispersibility, it is necessary to remove the coating agent. For this reason, the heat treatment or optical treatment is performed on the substrate after the ejection process.

Although the heat treatment and/or optical treatment is typically carried out in the atmosphere, if necessary, it may be carried out in an inert gas atmosphere, such as nitrogen, argon, and helium. A processing temperature of the heat treatment and/or optical treatment is suitably determined by taking into consideration a boiling point of the dispersion medium (steam pressure), the kind or pressure of an atmosphere gas, dispersibility of fine particles, and thermal behavior, such as oxidizability, existence and quantity of the coating agent, a heat-resistant temperature of a base, and the like. For example, in order to remove the coating agent made of the organic material, it is necessary to bake it at a temperature of about 300° C. However, in order to prevent the characteristic shift of the thin film transistor, the heat treatment is preferably performed at a temperature of less than 250° C. In addition, when a plastic substrate is used, the heat treatment is preferably performed in the range of room temperature to 100° C. By means of the above-mentioned process, a dry film after the ejection process allows an electrical contact between fine particles to be ensured and is converted to a conductive film.

By means of the above-mentioned process, the thin film transistor is formed, as shown in FIG. 4D. In the present embodiment, the residual thick film portion 33 of the second bank portion serves as an insulating film for insulating the source electrode 61a from the conductive film 68, and the residual thin film portion of the first bank portion 31b serves as a protective film for protecting a semiconductor layer 84.

Figure 7:
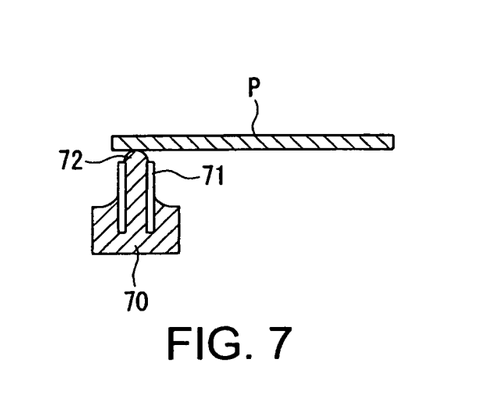
FIG. 7 is a schematic cross-sectional view illustrating a cap coating method.

In addition, in the first and second embodiments, the droplet ejection method using the droplet ejection device is employed in order to arrange the droplets (functional liquid). However, the invention is not limited thereto, but may use a Cap coating method, as shown in FIG. 7. The Cap coating method is a film forming method using a capillary phenomenon. According to this method, when a coating liquid plane is raised in a state in which slits 71 are formed in a coating liquid 70, a liquid clot 72 is generated at upper ends of the slits 71. In a state in which the substrate P comes into contact with the liquid clot 72, the substrate P moves parallel to a predetermined direction, so that the coating liquid 70 can be coated on the substrate P.

In addition, in the above-mentioned embodiments, the first material (electrode) and the second material (wiring line) are baked at the same time, but the second material may be arranged after baking the first material. In this case, it is possible to improve the stability of the formed first material with respect to the solvent (dispersion medium) in the second material arranging process.

In addition, the method of manufacturing the thin film transistor shown in the above-mentioned embodiments can be applied to various methods of manufacturing an electro-optical device having the above-mentioned thin film transistor. For example, it can be suitably employed when thin film transistors of a liquid crystal device, an organic electroluminescent display device, and a plasma display device are formed.

What is claimed is:

1. A method of manufacturing a thin film transistor, comprising:
    forming a gate electrode on a substrate;
    forming a gate insulating film on the gate electrode;
    forming a semiconductor layer on the gate insulating film;
    forming a bank including a first bank portion and a second bank portion, the first bank portion being located at substantially a central portion of the semiconductor layer, the second bank portion having a thin film portion for surrounding the semiconductor layer and a thick film portion for surrounding the thin film portion at a periphery of the semiconductor layer;
    arranging a first functional liquid containing a conductive material in a region surrounded by the thin film portion and the first bank portion such that the first functional liquid covers the semiconductor layer;
    drying the first functional liquid to obtain a first conductive film;
    selectively removing the thin film portion after drying the first functional liquid;
    arranging a second functional liquid including a conductive material in a region from which the thin film portion is removed such that the second functional liquid extends to the first conductive film; and
    drying the second functional liquid to obtain a second conductive film.

2. The method of manufacturing a thin film transistor according to claim 1,
    wherein the first conductive film constitutes a source electrode and/or a drain electrode.

3. The method of manufacturing a thin film transistor according to claim 1,
    wherein, in the forming of the bank, the bank is formed at substantially the central portion of the semiconductor layer such that the first bank portion separates a source electrode from a drain electrode.

4. The method of manufacturing a thin film transistor according to claim 1,
    wherein, in the forming of the bank, after a photosensitive resin layer having a uniform thickness is formed, exposure intensity is changed on a substrate plane when the photosensitive resin layer is exposed, so that the thin film portion and the thick film portion are formed.

5. The method of manufacturing a thin film transistor according to claim 1, further comprising:
    performing a lyophobic process on a surface of the bank after forming the bank.

6. The method of manufacturing a thin film transistor according to claim 1,
    wherein, in the arranging of the first functional liquid and the arranging the second functional liquid, the first and second functional liquid are arranged by a droplet ejection method using a droplet ejection device.

7. The method of manufacturing a thin film transistor according to claim 1,
    wherein, in the arranging of the first functional liquid and the arranging the second functional liquid, the first and second functional liquid are arranged by a CAP coating method using a capillary phenomenon.

8. The method of manufacturing a thin film transistor according to claim 1,
    wherein, in the removing of the thin film portion, the thin film portion is removed through ashing.

* * * * *